United States Patent [19]
Wong et al.

[11] Patent Number: 5,881,103
[45] Date of Patent: Mar. 9, 1999

[54] ELECTRONIC DEVICE WITH EQUALIZED AUDIO ACCESSORY AND METHOD FOR SAME

[75] Inventors: Chin Pan Wong, Ft. Lauderdale; Scott D. Gleason, Plantation, both of Fla.

[73] Assignee: Motorola, Inc., Schaumburg, Ill.

[21] Appl. No.: 510,986

[22] Filed: Aug. 3, 1995

[51] Int. Cl.⁶ .............................. H03H 7/40; H03G 3/00
[52] U.S. Cl. ........................................ 375/229; 381/103
[58] Field of Search .................................. 375/229, 230, 375/231, 232; 381/94, 98, 95, 103, 111, 122; 364/724.2

[56] References Cited

U.S. PATENT DOCUMENTS

| | | | |
|---|---|---|---|
| 4,611,343 | 9/1986 | Rapaich | 381/103 |
| 4,631,749 | 12/1986 | Rapaich | 381/103 |
| 4,679,233 | 7/1987 | Richardson et al. | 379/433 |
| 5,249,199 | 9/1993 | Mayer et al. | 375/1 |

*Primary Examiner*—Tesfaldet Bogure
*Assistant Examiner*—William Luther
*Attorney, Agent, or Firm*—Andrew S. Fuller

[57] ABSTRACT

An electronic device (110) provides equalization and/or compensation for a coupled audio accessory device (120). The audio accessory device (120) has a memory (220) that contains equalizer parameters (304, 308, 310, 314) which helps in characterizing its audio response or impact on audio signals within the electronic device (110). When the audio accessory device (120) is coupled to the electronic device (110), the electronic device (110) reads the equalizer parameters (304, 308, 310, 314) from the audio accessory's memory (220) and processes audio signals with equalization and/or compensation based at least in part on the equalizer parameters (304, 308, 310, 314).

10 Claims, 4 Drawing Sheets

ELECTRONIC DEVICE WITH EQUALIZED AUDIO ACCESSORY AND METHOD FOR SAME

TECHNICAL FIELD

This invention relates in general to electronic devices with audio accessories.

BACKGROUND OF THE INVENTION

Many electronic devices, such as those used for radio communications, support accessory connections for various functions. For example, a radio communication device may include an accessory interface that allows connection for an external audio accessory such as a microphone, an external speaker, or the like. Audio accessories come in a variety of configurations and may be available from several vendors. Generally, specifications standards established for the audio accessories govern the impact of these accessories on internal audio signal lines of the electronic device.

In many cases, audio signal processing components within the electronic device are optimized to work with a selected number of audio accessories. However, because of manufacturing variations for audio accessories, and because of the potential for unanticipated combinations of simultaneously attached audio accessories, it is difficult to design audio signal processing components which will properly accommodate all such variations and combinations. Consequently, the coupling of certain audio accessories to the electronic device may yield an audio response that is unsuitable or undesirable for other signal processing. For example, a radio may use a speech coder that depends on audio signals having a flat response. When an audio accessory is coupled which distorts the audio response, the function of the speech coder may be adversely affected.

Generally, radio designers accommodate variations in audio signal paths through filters and other signal processing components employed in the design of a circuit. The provision of these additional components can add considerable time and expense to the design process, but yet does not usually provide a total solution because of the coupling of unanticipated accessories or combinations thereof. As a result, an electronic device that was designed to perform within certain specifications for audio signal processing may not continue to meet those specifications when certain audio accessories are coupled. It is desirable to provide a more flexible solution to accommodate various accessories which may be coupled to an electronic device in order to ensure consistent performance. Hence, a new approach to the accommodation of audio accessories is needed.

DETAILED DESCRIPTION OF THE PREFERRED EMBODIMENT

Figure 1:
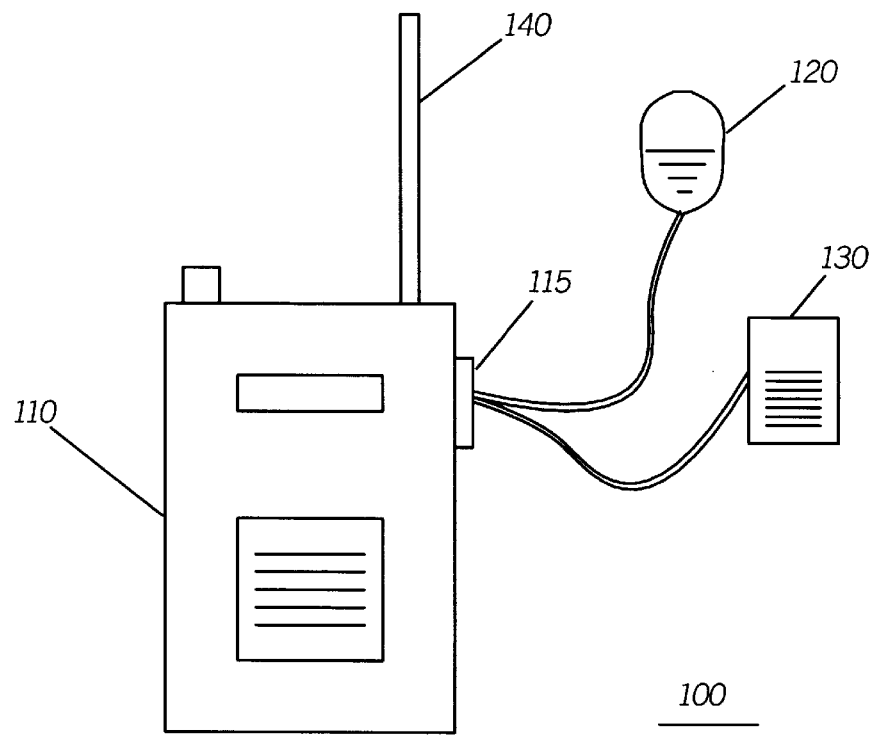
FIG. 1 is a simplified representation of a radio communication device having audio accessories interfaced thereto, in accordance with the present invention.

While the specification concludes with claims defining the features of the invention that are regarded as novel, it is believed that the invention will be better understood from a consideration of the following description in conjunction with the drawing figures, in which like reference numerals are carried forward.

Generally, the present invention provides a method for the equalization of audio signals associated with audio accessories coupled to an electronic device. Preferably, the audio response for the accessory device is characterized to determine one or more equalizer parameters. These equalizer parameters are stored within a preferably non-volatile memory within the audio accessory device. When the audio accessory device is coupled to the electronic device, the electronic device reads the equalizer parameters from the accessory memory and processes audio signals, such as those associated with the accessory device, with equalization based, at least in part, on the parameters stored within the audio accessory device.

FIG. 1 shows an electronic assembly 100, in accordance with the present invention. In the preferred embodiment, the electronic assembly 100 includes a two-way portable radio communication electronic device 110, that has communication circuitry for communicating over a radio frequency (RF) channel established via an antenna 140. The electronic device 110 has an accessory interface 115 which has two audio accessory devices 120, 130 coupled thereto. The audio accessory devices 120, 130 include a speaker microphone 120, and an external speaker 130. Both audio accessory devices 120, 130, are configured in accordance with the present invention.

Figure 2:
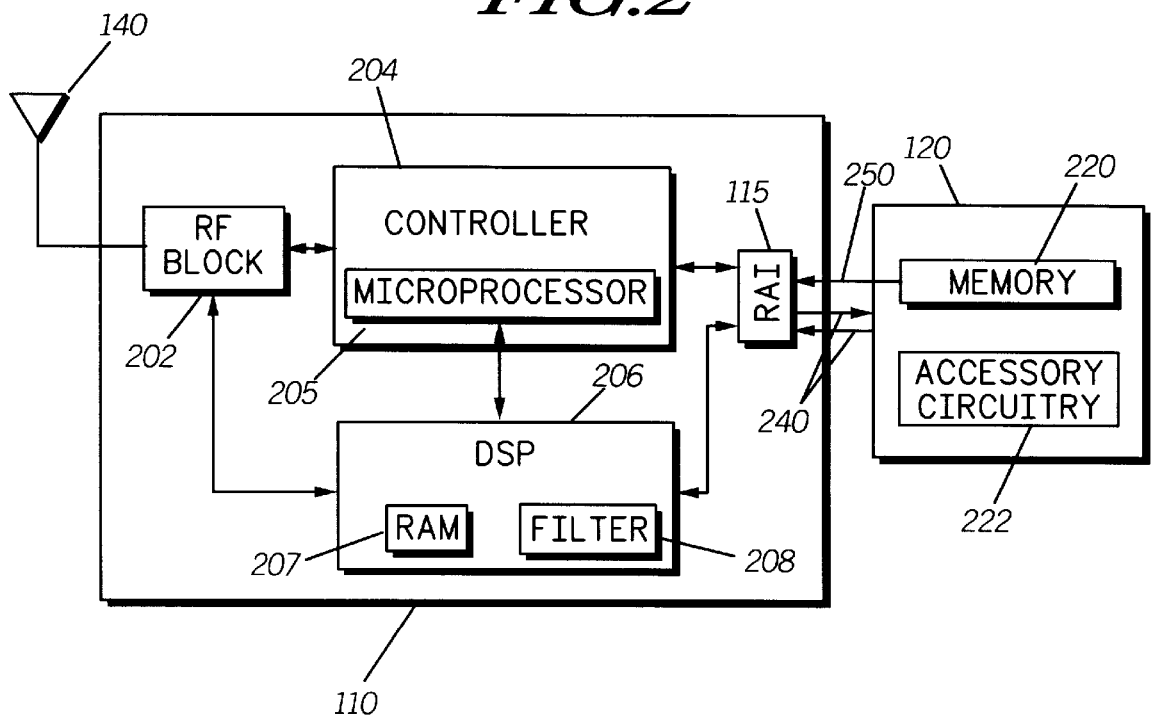
FIG. 2 is a block diagram of the radio communication device of FIG. 1, when coupled to an external audio accessory, in accordance with the present invention.

FIG. 2 is a block diagram of the radio communication device 110 with the speaker microphone 120 coupled thereto, in accordance with the present invention. The radio 110 includes, among other components, a radio frequency block 202, a controller 204, a digital signal processor (DSP) 206, and the radio accessory interface 115. The radio frequency block 202 includes communication circuitry for processing radio frequency signals that are received and sent via the antenna 140. The controller 204 preferably includes a microprocessor 205 that interacts with the digital signal processor 206 to process audio signals. The DSP 206 includes memory 207 in the form of random accessory memory (RAM), and a programmable filter 208 that processes audio signals. The filter 208 may be implemented within the DSP 206 via software and/or hardware components, using well known digital filter routines. The radio 110 operates under the direction of the controller 204.

The speaker microphone audio accessory 120 includes accessory circuitry 222 that implements the functions of the accessory, and a storage area or memory 220 that stores equalizer or equalization parameters corresponding to an audio response or impact characterization for the audio accessory. Preferably, the equalizer parameters stored in memory correspond to the potential impact that this accessory 120 has on the processing of audio signals within the radio 110. For example, in the preferred embodiment, the memory 220 stores information about gain and frequency equalization for the accessory. The memory 220 is non-volatile such that information stored therein is retained even when power is not applied to the accessory 120. The memory 220 is coupled to the radio accessory interface 115 via signal line 250 such that the parameters stored in the memory are accessible by the radio 110. Other signal lines 240 provide audio signals between the radio 110 and the accessory 120. The radio accessory interface 115 is preferably a serial line with a protocol defined to assist in the transfer of information between the radio and accessory reliably. Information from the memory 220 is retrieved by the radio 110, when the accessory is coupled to the radio 110, and a derivation of the information is used to program the programmable filter 208 within the DSP 206.

Preferably, the DSP 206 is used to implement audio level adjusting and frequency shaping using data supplied from the accessory 120. RAM 207 is used to store information received from the accessory via the radio accessory interface 115. The information within the RAM 207 is used by the filter 208 to effect a particular audio compensation for signals associated with the accessory. For example, the DSP 206 may interface to the audio analog input and output stages within the radio, which are used to process signals from an accessory, to drive analog voice or data signal lines for the accessory.

Figure 3:
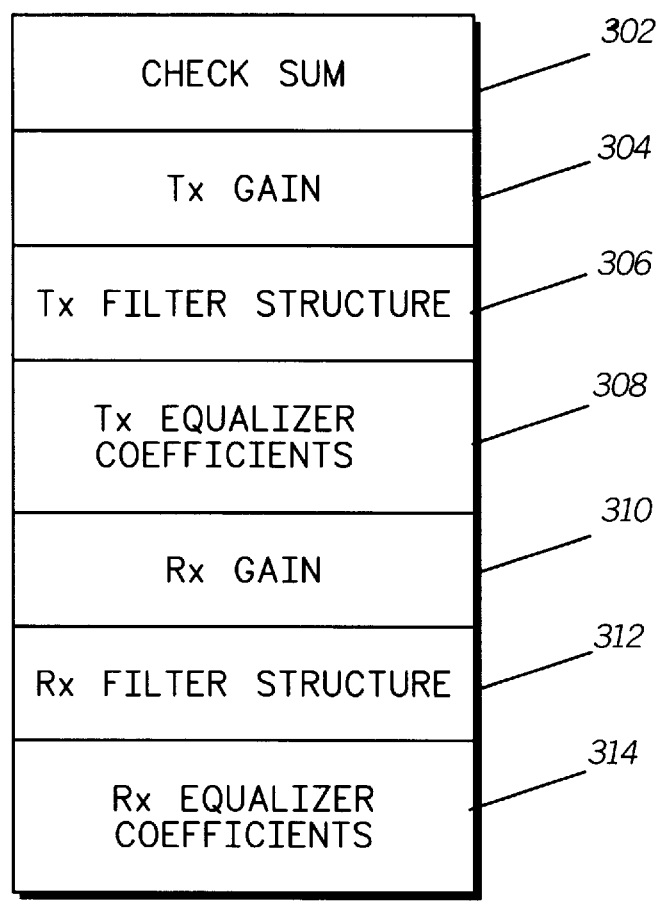
FIG. 3 is a block diagram describing memory contents of the audio accessory in accordance with the present invention.

FIG. 3 is a block diagram of the memory structure of the memory 220 of the accessory 120, in accordance with the present invention. The memory structure includes transmit and receive entries (or parameters) for gain, 304, 310; equalizer coefficients 308, 314; and filter structure 306, 312. The memory further includes a check sum 302 that is used to ensure data integrity within the memory 220. The check sum is calculated using commonly available routines.

The transmit and receive gain entries 304, 310 are scaling factors that adjust an audio path to a desired signal level, and are preferably frequency independent. The transmit/receive filter structure entry 306, 312, is an indicator for the type of digital filter structure which is to be used in implementing frequency shaping or equalization of the audio path. Various audio processing filters may be implemented within the DSP 206 and selected via the transmit/receiver filter structure 306, 312 entry. Such audio processing filters include an infinite impulse response (IIR) filter, a finite impulse response (FIR) filter, and a lattice filter, among others. The transmit/receive coefficients 308, 314 are preferably digital filter parameters used to effect desired characterization corresponding to the digital filter indicated by the transmit/ receive filter structure 306, 312.

Figure 4:
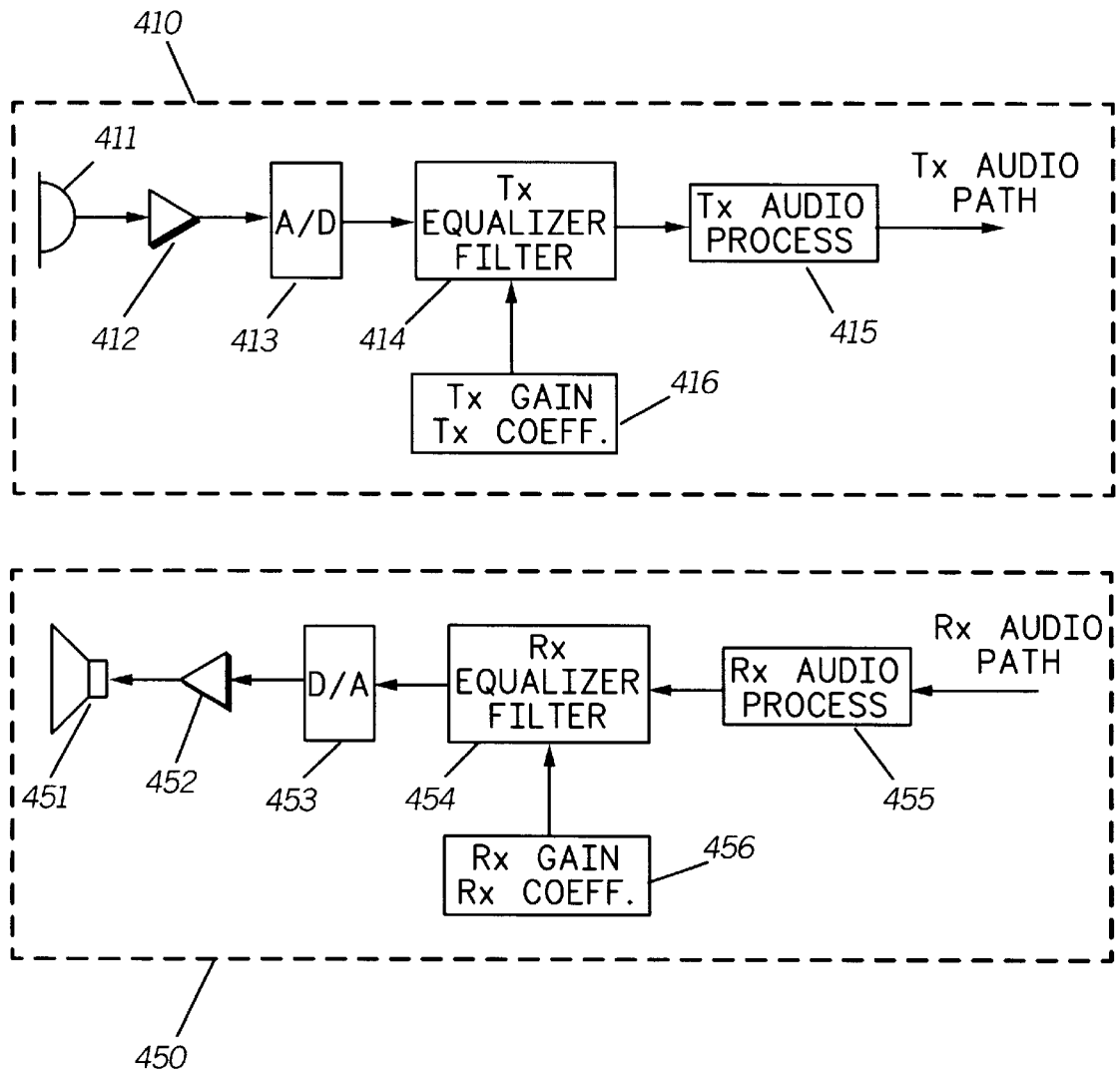
FIG. 4 is a block diagram highlighting audio signal processing within the radio communication device, in accordance with the present invention.

FIG. 4 is a block diagram highlighting signal processing for an input signal path 410 and an output signal path 450, in accordance with the present invention. Audio signals received, for example, from a microphone 411 via the attached audio accessory is amplified via an amplifier 412 and converted to digital signals via an analog to digital converter 413. The digital signals are routed to a programmable equalizer filter 414, which has been programmed with gain and equalizer coefficient parameters 416 derived from information retrieved from the audio accessory. The equalizer filter 414 corresponds to the programmable filter 208 described with respect to FIG. 2. The filtered digital audio signals are then processed via an audio processing block 415 and made available to other sections of the radio communication device 110 for processing.

Similarly, audio signals received by the radio communication device 110 is processed using audio processing circuitry 455. Audio processing of received signals may include voice decoding operations. The output of the audio processing circuitry 455 is filtered by a programmable filter 454, which has been programmed with gain and equalizer coefficient parameters 456 derived from information retrieved from the audio accessory. Once properly filtered according to the equalizer parameters derived from the audio accessory, the signals are converted to analog, via a digital to analog converter 453, amplified via amplifier 452, and sent to a speaker 451.

Thus, signals received from the audio accessory device 120 are processed according to equalizer parameters retrieved from the device and made available to the radio communication device 110 for further signal processing. Likewise, signals destined for the radio accessory device 120, such as for speaker 451, are first processed using the equalizer parameters derived from the audio accessory 120 that characterizes the speaker. Consequently, audio signals associated with the accessory device are appropriately processed.

Note, that the present invention also contemplates the combination of equalizer parameters retrieved from various attached accessory devices. As such, the most appropriate filter characteristic can be determined for application to the audio signals received from, or destined to, a particular audio accessory device. This combination of parameters may yield significantly improved performance for audio processing, when audio accessories from a variety of sources are combined.

Figure 5:
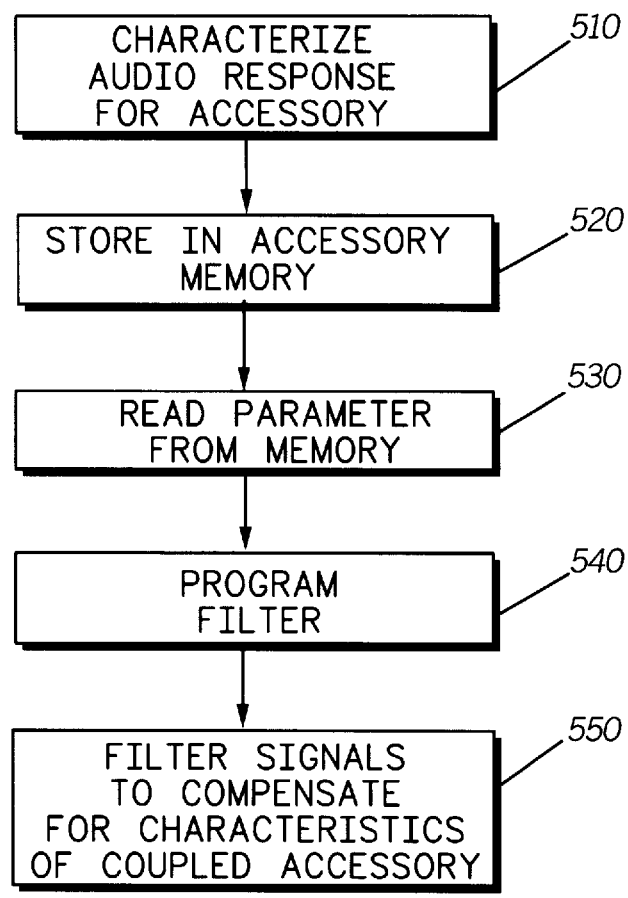
FIG. 5 is a flowchart of procedures for the equalization of signals associated with an audio accessory, in accordance with the present invention.

FIG. 5 is a flowchart of procedures 500 that summarize the method for equalizing audio accessory devices, in accordance with the present invention. The audio response for a particular accessory device is first characterized to determine equalization parameters, step 510. This may be accomplished by determining a reference audio response that corresponds to an ideal response for the accessory device. The audio accessory device is measured to determine an actual response which is compared with the referenced response to determine the equalizer parameters. In the preferred embodiment, a sample signal is applied across a frequency range defined for the audio accessory. Particular frequencies at which the audio device does not have a desired response are determined, and equalizer parameters are generated corresponding to the particular frequencies of the reference.

Once the accessory device is characterized, the equalizer parameters are stored in its non-volatile member, step 520. When the accessory is coupled to the electronic device, such as via the accessory interface, the electronic device reads the equalizer parameters from the audio accessory's memory, step 530. Subsequently, all audio signals associated with, or potentially impacted by, the coupled audio accessory device are preferably processed with equalization based, at least in part, on the equalizer parameters read from the accessory device, steps 540, 550. A programmable filter suitable for audio signals associated with the accessory device is programmed with the equalizer parameters and audio signals associated with, or impacted by, the accessory devices are filtered using the filter. Preferably, when multiple accessory devices that impact audio signal processing are coupled to the electronic device, equalizer parameters are read from their respective memories and combined to determined filter characteristics for the audio signals of the respective devices.

The present invention provides significant benefits over the prior art. For example, audio signal processing within a particular electronic device may be affected by characteristics of an attached accessory device. Such impact may be accommodated by a programming equalization parameters within the memory of the attached accessory device. An electronic device designer does not have to fully anticipate all combinations and variations of accessory devices that may be attached to the electronic device which may have an impact. Rather, certain adjustments can be made by accessing information stored within the attached accessory device. The present invention is equally applicable to accessory devices which do not process audio signals but which themselves may have an impact on the processing of audio signals within the attached electronic device. Such accessories may contain equalization parameters to be applied to the processing of audio signals within the electronic device.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method for providing equalization for detachable audio accessory devices, the method comprising the steps of:

simultaneously[1] coupling a plurality of detachable audio accessory devices to an electronic device through at least one interface connector, wherein each audio accessory device has a non-volatile memory programmed by:

characterizing audio response for the audio accessory device to determine at least one equalizer parameter;

storing the at least one equalizer parameter within the non-volatile memory;

at the electronic device:

reading at least one equalizer parameter, via the at least one interface connector from the non-volatile memory of each of the plurality of detachable audio accessory devices; and processing audio signals with equalization based at least in part on a combination of equalizer parameters wherein at least one of the equalizer parameters is obtained from each of the plurality of detachable audio accessory devices.

[1]The terminology 'simultaneously' should not be misconstrued to mean, in the context recited, any requirement that the 'action of attaching' occur at the same time. The term, in context, is considered to merely require that the devices must be attached concurrently.

2. The method of claim 1, wherein the step of characterizing audio response comprises the steps of:

determining a reference audio response that corresponds to an ideal response for the audio accessory device;

measuring the audio accessory device to determine an actual response; and comparing the actual response with the reference audio response to determine the at least one equalizer parameter.

3. The method of claim 2, wherein the step of characterizing audio response comprises the step of:

applying a sample signal across a frequency range defined for the audio accessory device;

determining particular frequencies at which the audio accessory device does not have a desired response; and generating equalizer parameters corresponding to the particular frequencies.

4. The method of claim 1, wherein the step of processing audio signals comprises the steps of:

programming a programmable filter within a digital signal processor with at least one equalizer parameter read from one of the plurality of detachable audio accessory devices; and filtering the audio signals using the programmable filter.

5. The method of claim 4, wherein the step of processing audio signals further comprises the step of applying the programmable filter when processing signals associated with one of the plurality of audio accessory devices.

6. A method, comprising the steps:

providing a first audio accessory device having a memory with at least one equalizer parameter stored therein that characterizes audio response for the first audio accessory device;

coupling the first audio accessory device to an electronic device;

at the electronic device:

reading a first equalizer parameter from the memory when the audio accessory device is coupled to the electronic device;

reading a second equalizer parameter from memory associated with a second audio accessory device simultaneously[2] coupled to the electronic device;

programming a programmable filter with a combination of the first and second equalizer parameters; and filtering audio signals associated with the audio accessory device using the programmable filter.

[2]See footnote 1.

7. An electronic assembly, comprising:

a plurality of audio accessory devices, each audio accessory device having a memory, the memory having at least one equalizer parameter stored therein, the at least one equalizer parameter characterizing audio response for the audio accessory device, and an electronic device simultaneously[3] interfaced to the plurality of audio accessory devices, the electronic device comprising a signal processor that includes a programmable filter;

wherein the filter is programmed based on a combination of equalizer parameters from the memories of the plurality of audio accessory devices, when the signal processor processes signals associated with at least one of the plurality of audio accessory devices.

[3]See footnote 1.

8. The electronic assembly of claim 7, wherein the signal processor comprises a digital signal processor.

9. The electronic assembly of claim 7, wherein the electronic device further comprises radio frequency communication circuitry.

10. The electronic assembly of claim 7, wherein the memory of at least one audio accessory device of the plurality of audio accessory devices has a parameter programmed therein that specifies a type of filter structure to be used in processing audio signals potentially impacted at least one by the audio accessory device.

* * * * *